(12) United States Patent
Kise et al.

(10) Patent No.: US 6,190,808 B1
(45) Date of Patent: Feb. 20, 2001

(54) X-RAY MASK AND METHOD OF MANUFACTURING THE SAME

(75) Inventors: Koji Kise; Sunao Aya; Takaaki Murakami, all of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/271,297

(22) Filed: Mar. 17, 1999

(30) Foreign Application Priority Data

Sep. 22, 1998 (JP) .................................................. 10-268205

(51) Int. Cl.⁷ ................................ G03F 9/00; G21K 5/00
(52) U.S. Cl. ..................................................... 430/5; 378/35
(58) Field of Search ........................... 430/5, 322; 378/35

(56) References Cited

U.S. PATENT DOCUMENTS

| 4,873,162 | 10/1989 | Yoshioka et al. | 430/5 |
| 5,496,667 | 3/1996 | Yabe et al. | 430/5 |
| 5,677,090 | 10/1997 | Marumoto et al. | 430/5 |

FOREIGN PATENT DOCUMENTS

| 63-110634 | 5/1988 | (JP) . |
| 6-36997 | 2/1994 | (JP) . |
| 6-163381 | 6/1994 | (JP) . |
| 8-97130 | 4/1996 | (JP) . |
| 8-203817 | 8/1996 | (JP) . |

*Primary Examiner*—S. Rosasco
(74) *Attorney, Agent, or Firm*—McDermott, Will & Emery

(57) ABSTRACT

An X-ray mask including a transfer pattern having high accuracy is obtained. In a method of manufacturing the X-ray mask, an X-ray absorber film preventing transmission of an X-ray is formed on a substrate. A resist film is formed on the X-ray absorber film. The substrate is placed on a movable member. Steps of moving the movable member and irradiating the resist film with an energy beam are repeated for carrying out a drawing step of drawing a pattern on the resist film. Between the step of placing the substrate on the movable member and the drawing step, a step of holding a mask member including the resist film, the X-ray absorber film and the substrate to be in a state substantially identical to thermal equilibrium in the drawing step is carried out.

20 Claims, 14 Drawing Sheets

X-RAY MASK AND METHOD OF MANUFACTURING THE SAME

BACKGROUND OF THE INVENTION

1. Field of the Invention

The present invention relates to an X-ray mask and a method of manufacturing the same, and more specifically, it relates to an X-ray mask including a transfer pattern having high accuracy and a method of manufacturing the same.

2. Description of the Prior Art

A semiconductor device is now being refined and implemented with higher density of integration. In a photolithographic step included in steps of fabricating a semiconductor device, therefore, formation of a finer pattern is required. Study is recently made on employment of X-rays having shorter wavelengths than ultraviolet rays, generally employed in the photolithographic step, for exposure. FIG. 29 is a sectional view showing a conventional X-ray mask employed in such a photolithographic step with X-rays.

Referring to FIG. 29, the conventional X-ray mask includes a silicon wafer 101, a membrane 102, an X-ray absorber film 104 and a support ring 109. The membrane 102 is formed on the silicon wafer 101. A window part 103 partially exposing the membrane 102 is formed in the silicon wafer 101. A transfer pattern 111 is formed on a region of the X-ray absorber film 104 located on the window part 103. The support ring 109 is set under the silicon wafer 101. The surface of the X-ray absorber film 104 can be divided into a transfer pattern region 106 provided with the transfer pattern 111, a transfer pattern peripheral region 107 located on the window part 103 to enclose the transfer pattern 111 and a window part peripheral region 108 located on the silicon wafer 101.

In a method of manufacturing this X-ray mask, the membrane 102 is first formed on the silicon wafer 101. The X-ray absorber film 104 is formed on the membrane 102. The window part 103 is formed in the silicon wafer 101. The support ring 109 is set on the lower surface of the silicon wafer 101. A resist film (not shown) is applied onto the X-ray absorber film 104. A resist pattern (not shown) for forming the transfer pattern 111 is drawn on the resist film with an electron beam. Then, development is performed for forming the resist pattern on the resist film. The X-ray absorber film 104 is partially removed by etching through the resist pattern serving as a mask, for forming the transfer pattern 111. Thereafter the resist film is removed. The conventional X-ray mask is thus prepared.

The transfer pattern 111 of the X-ray mask, directly influencing the accuracy of circuits of the semiconductor device or the like, must have high dimensional accuracy and positional accuracy. Therefore, the resist pattern drawn on the resist film formed on the X-ray absorber film 104 with the electron beam must also have high dimensional accuracy and positional accuracy.

When drawing the resist pattern on the resist film with the electron beam in the step of manufacturing the X-ray mask, the X-ray mask is fixed to a cassette (EB cassette). This EB cassette is fixed to a stage provided in a chamber of an electron beam drawing unit.

The resist pattern to be drawn is divided into a plurality of sections (fields), each of which is drawn with the electron beam. The stage carrying the X-ray mask thereon is mechanically moved between the fields for drawing the pattern. When the stage is moved, the temperature of the X-ray mask is increased due to frictional heat at contact parts between the stage and a base or heat generation from a motor employed for moving the stage. The membrane, the X-ray absorber film and the like forming the X-ray mask are thermally expanded due to the increased temperature of the X-ray mask. Consequently, the region of the X-ray mask to be provided with the resist pattern is distorted.

The temperature of the X-ray mask is also increased by the electron beam, which is an energy beam, applied thereto for drawing the resist pattern. Consequently, the region of the X-ray mask to be provided with the resist pattern is further distorted.

When starting to draw the resist pattern on the X-ray mask with the electron beam, therefore, the distortion of the region to be provided with the resist pattern is increased. FIG. 30 is a graph showing the qualitative relation between positional distortion of a conventional X-ray mask caused by temperature rise when drawing a resist pattern thereon with an electron beam in a step of manufacturing the X-ray mask and time. Referring to FIG. 30, the axis of abscissas shows the time and the axis of ordinates shows the distortion of the X-ray mask. The operation of drawing the resist pattern with the electron beam is started at a time $t_1$. The distortion is gradually increased up to a time $t_2$, as shown by a curve AB.

At the time $t_2$, the quantity of heat inputted the X-ray mask balances with that of heat diffused therefrom to stabilize the temperature of the X-ray mask. Therefore, the distortion remains substantially unchanged. The distortion is thereafter substantially stabilized and the X-ray mask is substantially in thermal equilibrium up to a time $t_3$ for completing the drawing, as shown on a line BC.

Thus, the distortion of the X-ray mask changes with time when drawing the resist pattern with the electron beam, to result in distortion of the drawn resist pattern. The rate of change of the distortion has pattern dependency, to cause dispersion in accuracy of the resist pattern. Therefore, the transfer pattern formed with the resist pattern is disadvantageously deteriorated in accuracy.

In order to prevent the transfer pattern from deterioration of accuracy, the following techniques have been proposed in general:

Japanese Patent Laying-Open No. 6-163381 (1994) discloses a technique of providing at least two marks on an EB cassette and drawing a resist pattern with an electron beam while correcting distortion of an X-ray mask resulting from temperature rise by detecting the marks. In this case, the position for drawing the resist pattern can be corrected following temporal change of the distortion. However, the position for drawing the resist pattern must be minutely re-calculated in response to the result of measurement of the distortion, disadvantageously leading to complicated control. In order to apply this technique to a conventional electron beam drawing unit, further, the electron beam drawing unit must be altered. Therefore, the cost for manufacturing the X-ray mask is disadvantageously increased due to necessary capital investment.

Japanese Patent Laying-Open No. 8-97130 (1996) discloses a technique of mounting a heater on an EB cassette for controlling the temperature of an X-ray mask. In this technique merely indirectly controlling the temperature of the X-ray mask through the EB cassette, however, it is difficult to improve the accuracy for controlling the temperature of the X-ray mask. Consequently, it is difficult to correctly control distortion of the X-ray mask caused by heat and hence the accuracy of the resist pattern cannot be readily improved.

Japanese Patent Laying-Open No. 6-36997 (1994) discloses the following technique: Temperature change of a driving table (stage) is previously monitored while drawing a resist pattern with an electron beam for obtaining data thereof. Distortion of the driving table caused by thermal expansion corresponding to the time for drawing the pattern is calculated on the basis of the data on the temperature change, the thermal expansion coefficient of the driving table and the like. The distortion is fed back to a table coordinate system or a deflection control system for the electron beam for drawing the pattern, thereby improving the accuracy of the resist pattern. In this technique of previously obtaining the data on the temperature change of the driving table with respect to the drawing time and calculating the distortion on the basis of the data, however, it is difficult to cope with dispersion in preparation of the X-ray mask when actually drawing the resist pattern. Consequently, the accuracy of the resist pattern is disadvantageously deteriorated.

Japanese Patent Laying-Open No. 63-110634 (1988) discloses an X-ray mask forming a stress relaxation pattern on an X-ray absorber film located around a transfer pattern for preventing the transfer pattern from deformation caused by stress on the X-ray absorber film. In the technique disclosed in this gazette, however, it is difficult to solve the problem of deterioration in accuracy of the transfer pattern resulting from heat applied for drawing the pattern. Further, the time for manufacturing the X-ray mask is increased due to the stress relaxation pattern formed on the overall surface of the X-ray absorber film located around the transfer pattern, to disadvantageously increase the preparation cost.

Japanese Patent Laying-Open No. 8-203817 (1996) discloses the following technique: A resist pattern is previously formed on an X-ray mask and displacement of the resist pattern resulting from stress on an X-ray absorber film is calculated. A drawing pattern for the resist pattern is rearranged to compensate for the displacement. Then, the X-ray mask is prepared with the rearranged drawing pattern. In the technique disclosed in the above gazette, however, it is difficult to solve the problem resulting from drawing of the drawing pattern in a non-stationary state with fluctuating distortion of the X-ray mask.

SUMMARY OF THE INVENTION

An object of the present invention is to provide a method of manufacturing an X-ray mask, which can obtain an X-ray mask including a transfer pattern having high accuracy regardless of heat generated when drawing a resist pattern for forming the transfer pattern.

Another object of the present invention is to provide an X-ray mask including a transfer pattern having high accuracy.

In a method of manufacturing an X-ray mask according to a first aspect of the present invention, an X-ray absorber film for preventing transmission of an X-ray is formed on a substrate. A resist film is formed on the X-ray absorber film. The substrate is placed on a movable member. Steps of moving the movable member and irradiating the resist film with an energy beam are repeated for carrying out a drawing step of drawing a pattern on the resist film. Between the step of placing the substrate on the movable member and the drawing step, a mask member including the resist film, the X-ray absorber film and the substrate is held to be in a state substantially identical to thermal equilibrium in the drawing step.

Therefore, the mask member can be brought into a state substantially identical to thermal equilibrium in the drawing step before carrying out the drawing step, and hence the mask member can be prevented from temperature fluctuation in the drawing step. In the drawing step, therefore, the mask member can be prevented from fluctuation of distortion resulting from thermal expansion thereof caused by temperature change. Consequently, the drawn pattern can be prevented from deterioration of accuracy resulting from change of the distortion of the mask member during the drawing step. Thus, an X-ray mask including a transfer pattern having high accuracy can be obtained.

Distortion of the mask member, which is in thermal equilibrium from the start of the drawing step, is substantially identical as to every directional component in the drawing step as compared with a state held at the room temperature. Therefore, an X-ray mask including a transfer pattern having high accuracy can be readily prepared by correcting the pattern drawn in the drawing step to be vertically and transversely enlarged or reduced by amounts corresponding to the distortion.

The transfer pattern can be vertically and transversely corrected in substantially uniform scales also through a mask distortion correcting function of an X-ray exposure unit. Even if the pattern drawn in the drawing step is not corrected with reflection of the distortion caused by heat and the transfer pattern of the X-ray mask is reduced in correspondence to the distortion, therefore, a pattern of prescribed accuracy can be transferred to a semiconductor substrate or the like through the mask distortion correcting function of the X-ray exposure unit in X-ray exposure. Therefore, the X-ray mask can be prepared without correcting the drawn pattern while reflecting the distortion, and hence preparation of the X-ray mask can be more simplified.

In the method of manufacturing an X-ray mask according to the first aspect of the present invention, the step of holding the mask member may include a step of drawing a preliminary drawing pattern on a region of the mask member other than that to be provided with the pattern.

Thus, an electron beam drawing unit employed in the drawing step can be directly applied to the step of holding the mask member, and hence the inventive method of manufacturing an X-ray mask can be carried out without remarkably altering a unit employed for manufacturing a conventional X-ray mask. Consequently, the cost for manufacturing the X-ray mask can be saved.

In the method of manufacturing an X-ray mask according to the first aspect of the present invention, the preliminary drawing pattern may include a pattern substantially identical to a part of the pattern.

Thus, conditions such as a stage moving path and the dose of an electron beam for drawing the pattern in the step of drawing the preliminary drawing pattern can be rendered substantially identical to those in the drawing step. Consequently, the drawing step and the step of drawing the preliminary drawing pattern can be carried out under substantially identical conditions of stage movement and heat input in the mask member irradiated with the electron beam, and hence the state substantially identical to thermal equilibrium in the drawing step can be readily implemented.

In the method of manufacturing an X-ray mask according to the first aspect of the present invention, the preliminary drawing pattern may be drawn with an energy beam in the step of drawing the preliminary drawing pattern, and the energy beam employed in the step of drawing the preliminary drawing pattern may be lower in intensity than that employed in the drawing step.

The term "energy beam" indicates an electron beam or an ultraviolet ray employed for pattern drawing. If the energy beam such as an electron beam employed for drawing the pattern in the drawing step has high energy, part thereof is transmitted through the X-ray absorber film and the resist film. Consequently, part of the energy of the energy beam is not absorbed by the mask member and does not contribute to temperature rise of the mask member. In general, a window part is formed on the substrate under the region of the resist film to be provided with the pattern in the drawing step. Therefore, the energy beam is more readily transmitted through the region to be provided with the pattern in the drawing step than that to be provided with the preliminary drawing pattern. Thus, the quantity of heat, resulting from the energy beam, absorbed by the mask member in the step of drawing the preliminary drawing pattern can be reduced by reducing the intensity of the energy beam in the step of drawing the preliminary drawing pattern. Consequently, the quantities of heat inputted in the mask member can be rendered substantially identical in the drawing step and the step of drawing the preliminary drawing pattern. Thus, the mask member can be more readily held to be in the state substantially identical to thermal equilibrium in the drawing step.

In the method of manufacturing an X-ray mask according to the first aspect of the present invention, the preliminary drawing pattern may be drawn with an energy beam in the step of drawing the preliminary drawing pattern, and the energy beam employed in the step of drawing the preliminary drawing pattern may be higher in intensity than that employed in the drawing step.

Thus, the quantity of heat inputted in the mask member with the energy beam per unit time in the step of drawing the preliminary drawing pattern can be rendered larger than that in the drawing step. Consequently, the mask member can be heated to more quickly enter the state substantially identical to thermal equilibrium in the drawing step. Thus, the time required for the step of drawing the preliminary drawing pattern can be reduced.

The method of manufacturing an X-ray mask according to the first aspect of the present invention may further include a step of measuring relative distortion of the mask member in the drawing step with respect to a state held at the room temperature, and the drawing step may include a step of drawing the pattern in consideration of the distortion.

Thus, the pattern is drawn in consideration of the distortion resulting from heat in the drawing step, and hence the accuracy of the pattern formed on the resist film can be further improved.

In the method of manufacturing an X-ray mask according to the first aspect of the present invention, the step of drawing the pattern in consideration of the distortion may include steps of converting the pattern to a corrected pattern corresponding to the distortion and drawing the corrected pattern on the resist film.

In the method of manufacturing an X-ray mask according to the first aspect of the present invention, the step of drawing the pattern in consideration of the distortion may include a step of adjusting a reference unit length in movement of the movable member in consideration of the distortion.

In the step of drawing the pattern in consideration of the distortion, therefore, the pattern can be drawn without being converted to the corrected pattern corresponding to the distortion, by changing the reference unit length in movement of the movable member. Consequently, the preparation steps for the X-ray mask can be simplified with no necessity for the step of converting the pattern to the corrected pattern corresponding to the distortion.

In the method of manufacturing an X-ray mask according to the first aspect of the present invention, an alignment mark may be formed on the substrate, and the step of measuring the distortion may include a step of measuring the position of the alignment mark.

Thus, the distortion can be measured through the alignment mark formed on the substrate on a position closer to the region to be provided with the pattern as compared with an EB cassette or the like carrying the X-ray mask, and hence the distortion can be measured in higher accuracy. Consequently, a pattern having higher accuracy can be drawn. Thus, an X-ray mask including a transfer pattern having high accuracy can be prepared.

In the method of manufacturing an X-ray mask according to the first aspect of the present invention, an alignment mark may be formed on the substrate, and the step of holding the mask member may include a step of detecting the alignment mark.

In general, the step of detecting the alignment mark is periodically carried out in the drawing step, in order to correct beam drifting or distortion of a field shape. Also in the step of detecting the alignment mark, heat is generated due to stage movement or the like. This heat increases the temperature of the mask member. When the step of detecting the alignment mark is also carried out in the step of holding the mask member similarly to the drawing step, therefore, the mask member can readily be held to be in the state substantially identical to thermal equilibrium in the drawing step. Thus, the mask member can be prevented from temperature fluctuation and change of distortion in the drawing step, and hence the accuracy of the drawn pattern can be improved. Consequently, an X-ray mask including a transfer pattern having high accuracy can be obtained.

In the method of manufacturing an X-ray mask according to the first aspect of the present invention, the step of holding the mask member may include a preliminary moving step of moving the movable member.

When the preliminary moving step for moving the movable member is carried out similarly to the drawing step, therefore, heat resulting from movement of the movable member can be generated also in the step of holding the mask member similarly to the drawing step. Thus, the mask member can be more readily held to be in the state substantially identical to thermal equilibrium in the drawing step.

If the energy beam such as an electron beam employed in the drawing step has high energy, the energy beam may be transmitted through the resist film or the X-ray absorber film. In this case, the mask member is hardly heated by the energy beam. Further, the heat generated by movement of the movable member may form most part of the source for the heat inputted in the mask member in the drawing step. Also in this case, the mask member can be readily held to be in the state substantially identical to thermal equilibrium in the drawing step by carrying out the preliminary moving step in a state applying no energy beam or reducing the dose of the energy beam in the step of holding the mask member.

In the method of manufacturing an X-ray mask according to the first aspect of the present invention, the preliminary moving step may include a step of moving the movable member in a moving state substantially identical to that for drawing a partial pattern while moving the movable member in the drawing step.

Thus, the quantity of the heat generated by movement of the movable member in the preliminary moving step can be rendered substantially identical to that of the heat generated by movement of the movable member in the drawing step.

Consequently, the mask member can be more readily held to be in the state substantially identical to thermal equilibrium in the drawing step.

In the method of manufacturing an X-ray mask according to the first aspect of the present invention, the energy beam may be an electron beam.

In the method of manufacturing an X-ray mask according to the first aspect of the present invention, the step of holding the mask member may include a step of irradiating the mask member with a laser beam.

An X-ray mask according to a second aspect of the present invention includes a substrate and an X-ray absorber film. The X-ray absorber film, preventing transmission of an X-ray, is formed on the substrate. The X-ray absorber film includes a transfer pattern and a dummy pattern only formed on a part of a region other than that formed with the transfer pattern.

Therefore, the X-ray mask can be held to be in a state substantially identical to thermal equilibrium in a step of drawing a resist pattern for forming the transfer pattern by carrying out a step of drawing a resist pattern for forming the dummy pattern before the step of drawing the resist pattern for forming the transfer pattern. When the resist pattern is drawn on the X-ray mask in the state substantially identical to thermal equilibrium, the X-ray mask can be inhibited from temperature fluctuation in the drawing step. Thus, the X-ray mask can be inhibited from fluctuation of distortion resulting from temperature fluctuation thereof in the drawing step. Consequently, an X-ray mask including a transfer pattern having high accuracy can be obtained.

When drawing the resist pattern for forming the dummy pattern, heat generated by movement of a stage or an electron beam employed for drawing the resist pattern is transmitted to the overall X-ray mask due to heat conduction, and hence the X-ray mask can be brought into thermal equilibrium. Therefore, the dummy pattern may be only formed on the part of the region other than that formed with the transfer pattern. Consequently, the step of forming the dummy pattern can be simplified as compared with a case of forming the dummy pattern on the overall surface of the region other than that formed with the transfer pattern. Therefore, steps of manufacturing the X-ray mask can be prevented from complication. Consequently, the cost for manufacturing the X-ray mask can be reduced.

In the X-ray mask according to the second aspect of the present invention, the dummy pattern may include a pattern substantially identical to a part of the transfer pattern.

Thus, movement of the stage carrying the X-ray mask thereon for drawing the resist pattern for forming the dummy pattern and the dose of an electron beam for drawing the resist pattern can be rendered substantially identical to those for drawing the resist pattern for forming the transfer pattern. Consequently, the X-ray mask can be more readily held to be in the state identical to thermal equilibrium in the step of drawing the resist pattern for the transfer pattern through the step of forming the dummy pattern. When drawing the resist pattern for forming the transfer pattern, therefore, the X-ray mask can be more prevented from fluctuation of distortion caused by heat. Consequently, an X-ray mask including a transfer pattern having higher accuracy can be obtained.

An X-ray mask according to a third aspect of the present invention includes a substrate and an X-ray absorber film. The X-ray absorber film, preventing transmission of an X-ray, is formed on the substrate. The X-ray absorber film includes a transfer pattern and a dummy pattern, having a pattern substantially identical to a part of the transfer pattern, formed on a region other than that formed with the transfer pattern.

Thus, movement of a stage carrying the X-ray mask thereon for drawing a resist pattern for forming the dummy pattern and the dose of an energy beam such as an electron beam employed for drawing the resist pattern are substantially identical to those for drawing a resist pattern for forming the transfer pattern. When carrying out a step of holding the X-ray mask to be in a state substantially identical to thermal equilibrium in a drawing step for drawing the resist pattern for forming the transfer pattern before the drawing step, a step of drawing the resist pattern for forming the dummy pattern is carried out in the step of holding the X-ray mask. Consequently, the X-ray mask can be more readily held to be in the state identical to thermal equilibrium in the drawing step. When thereafter carrying the aforementioned drawing step, the X-ray mask can be inhibited from temperature fluctuation in the drawing step. Thus, the X-ray mask can be inhibited from fluctuation of distortion caused by temperature fluctuation in the drawing step. Consequently, an X-ray mask including a transfer pattern having higher accuracy can be obtained.

The X-ray mask according to the second or third aspect of the present invention may further include an alignment mark formed on the substrate.

In general, a step of detecting the alignment mark is periodically carried out in the drawing step, in order to correct beam drifting or distortion of a field shape. Also in the step of detecting the alignment mark, heat is generated due to stage movement or the like. This heat increases the temperature of the X-ray mask. When the step of detecting the alignment mark is carried out in the step of holding the X-ray mask to be in the state substantially identical to thermal equilibrium in the step of drawing the resist pattern for forming the transfer pattern, therefore, the X-ray mask can be more readily held to be in the state substantially identical to thermal equilibrium.

In the X-ray mask according to the second or third aspect of the present invention, the substrate may include a membrane formed to be in contact with the X-ray absorber film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Embodiment 1

The process flow of a method of manufacturing an X-ray mask according to an embodiment 1 of the present invention is now described with reference to FIG. 1.

Figure 1:
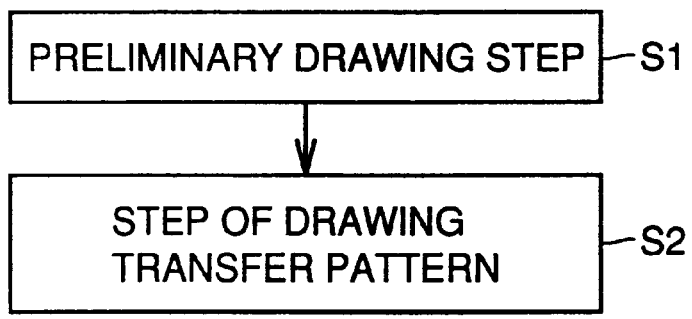
FIG. 1 is a process flow chart of a method of manufacturing an X-ray mask according to an embodiment 1 of the present invention.

Referring to FIG. 1, a preliminary drawing step (S1) is carried out before a step (S2) of drawing a transfer pattern in the method of manufacturing an X-ray mask according to this embodiment. In the preliminary drawing step (S1), the X-ray mask is irradiated with an electron beam and a stage carrying the X-ray mask thereon is moved. A state substantially identical to thermal equilibrium of the X-ray mask attained in the step of drawing the transfer pattern can be previously implemented by applying heat resulting from the preliminary drawing step to the X-ray mask. Consequently, the X-ray mask can be prevented from fluctuation of distortion resulting from temperature fluctuation thereof in the step of drawing the transfer pattern, and hence an X-ray mask including a transfer pattern having high accuracy can be obtained.

Figure 2:
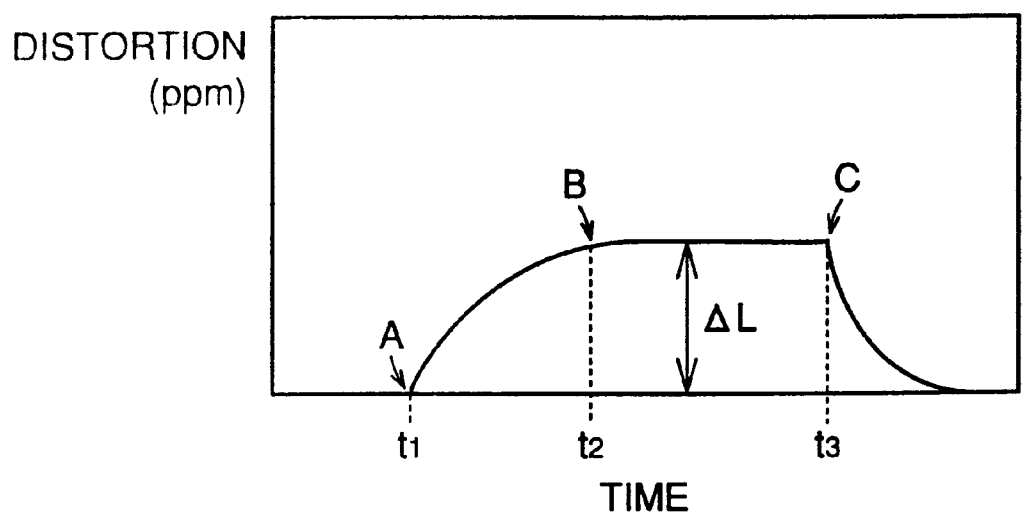
FIG. 2 is a graph showing the qualitative relation between positional distortion of an X-ray mask in steps of manufacturing an X-ray mask according to the embodiment 1 of the present invention and time.

Referring to FIG. 2, the preliminary drawing step is started at a time $t_1$. In this preliminary drawing step, the heat inputted in the X-ray mask is adjusted to be substantially identical in quantity to that inputted in the step of drawing the transfer pattern by adjusting the intensity of the applied electron beam, the movement pattern for the stage and the like. The temperature of the X-ray mask is increased through the preliminary drawing step. Consequently, distortion of the X-ray mask is also increased as shown in FIG. 2. The X-ray mask can be brought into the state substantially identical to thermal equilibrium in the step of drawing the transfer pattern by carrying out the preliminary drawing pattern up to a time $t_2$. Referring to FIG. 2, symbol ΔL denotes the current distortion. Thus, distortion is changed as shown on a line AB in the preliminary drawing step. The step of drawing the transfer pattern is carried out from the time $t_2$. At the time $t_2$, the X-ray mask is already held in the state substantially identical to thermal equilibrium implemented in the step of drawing the transfer pattern. Therefore, the distortion of the X-ray mask caused by heat remains unchanged in the step of drawing the transfer pattern. Consequently, the transfer pattern can be prevented from local distortion resulting from fluctuation of the distortion of the X-ray mask. Thus, an X-ray mask including a transfer pattern having high accuracy can be prepared.

The X-ray mask can be held in thermal equilibrium by previously carrying out the preliminary drawing step, and hence the region to be provided with the transfer pattern is substantially identically distorted by heat in every direction in the plane of the X-ray mask to be provided with the transfer pattern. When drawing the transfer pattern with no consideration on the distortion ΔL of the X-ray mask caused by heat, therefore, the transfer pattern finally formed on the X-ray mask is identically reduced in every direction in the plane formed with the transfer pattern. With this X-ray mask, therefore, a pattern of a desired size can be transferred onto a semiconductor substrate through a mask distortion correcting function of an X-ray exposure unit. Consequently, a pattern for drawing the transfer pattern may not be corrected in consideration of the distortion ΔL of the X-ray mask caused by heat. Therefore, the steps of manufacturing the X-ray mask can be simplified. Thus, the cost for manufacturing the X-ray mask can be reduced.

The method of manufacturing the X-ray mask is now described with reference to FIGS. 3 to 8.

Figure 3:
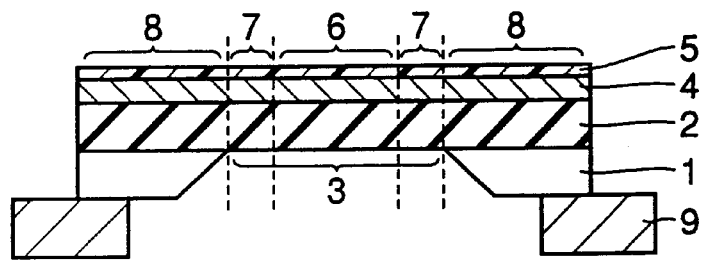
FIGS. 3 to 8 are typical sectional views showing first to sixth steps of the method of manufacturing an X-ray mask according to the embodiment 1 of the present invention respectively.

First, a membrane 2 of silicon carbide (SiC) is formed on a silicon wafer 1, as shown in FIG. 3. An X-ray absorber film 4 containing tungsten or titanium is formed on the membrane 2. A window part 3 for exposing the rear surface of the membrane 2 is formed in the silicon wafer 1. A support ring 9 is set on the lower surface of the silicon wafer 1. A resist film 5 is formed on the X-ray absorber film 4. A transfer pattern forming region 6 and a transfer pattern peripheral region 7 are positioned on a region located on the window 3. A window part peripheral region 8 is positioned on the remaining region located on the silicon wafer 1.

Figure 4:
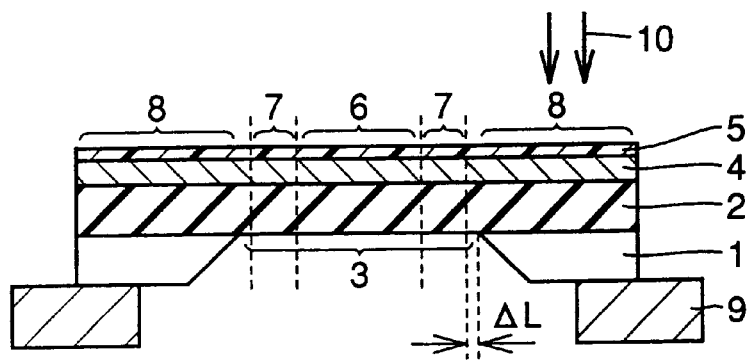

Then, the preliminary drawing step is then carried out as shown in FIG. 4. In this preliminary drawing step, a preliminary drawing pattern is drawn by irradiating a part of the resist film 5 located on the window part peripheral region 8 with an electron beam 10. Alternatively, the electron beam 10 may be applied to a region of the X-ray mask provided with no resist film 5. At this time, a stage carrying the X-ray mask thereon may be moved similarly to the step of drawing the transfer pattern. In this case, heat is generated due to the application of the electron beam 10 or the movement of the stage. This heat is transmitted to the X-ray mask to thermally expand the same. The region of the X-ray mask to be provided with the transfer pattern is distorted due to the thermal expansion thereof. At this time, the X-ray mask is held to be in a state substantially identical to thermal equilibrium in the step of drawing the transfer pattern by adjusting the dose of the electron beam 10 or the amount of movement of the stage. Consequently, the distortion ΔL can be adjusted to be substantially identical to distortion in the step of drawing the transfer pattern.

Figure 5:
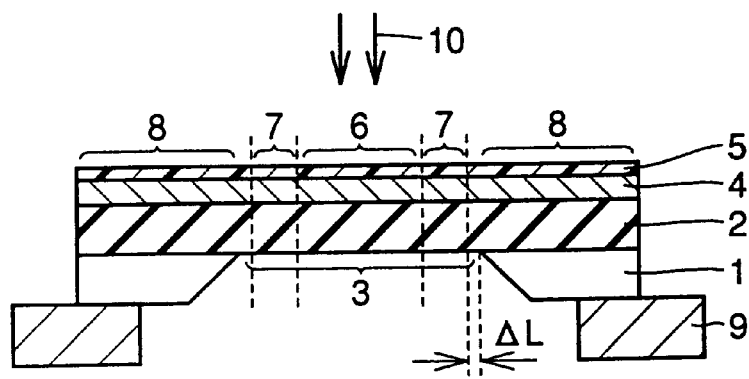

Then, a part of the resist film 5 located on the transfer pattern forming region 6 is irradiated with an electron beam 10 for drawing the transfer pattern, as shown in FIG. 5. At this time, the X-ray mask is held in thermal equilibrium due to the previously performed preliminary drawing step, and hence the distortion ΔL is maintained substantially constant. The region of the X-ray mask to be provided with the transfer pattern is substantially isotropically distorted in the plane to be provided with the transfer pattern. Even if the transfer pattern drawn with the electron beam 10 is not adjusted in consideration of the distortion ΔL, therefore, the transfer pattern formed on the X-ray mask is finally in a state substantially isotropically reduced. When performing X-ray exposure with the isotropically reduced transfer pattern, a desired pattern can be transferred onto a semiconductor substrate through a mask distortion correcting function of an X-ray exposure unit. Therefore, the drawing pattern employed for drawing the transfer pattern may not be corrected in consideration of the distortion ΔL. Thus, the steps of manufacturing the X-ray mask can be simplified.

Figure 6:
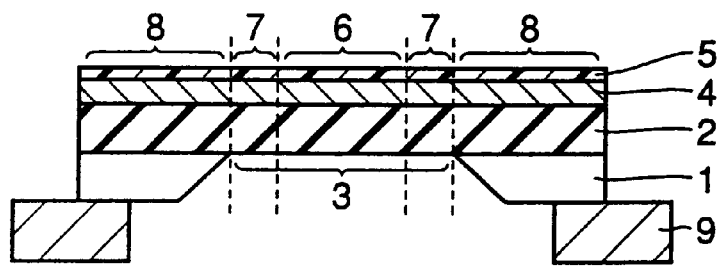

Following completion of the step of drawing the transfer pattern shown in FIG. 5, the application of the electron beam 10 (see FIG. 5) and the movement of the stage are also completed and hence heat input in the X-ray mask is stopped. Thus, the temperature of the X-ray mask is reduced. Consequently, the distortion of the X-ray mask resulting from thermal expansion disappears as shown in FIG. 6.

Figure 7:
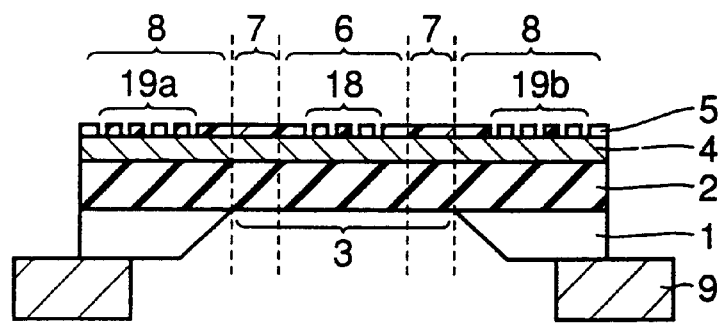

Then, the resist film 5 is developed for forming a transfer pattern 18 and preliminary drawing patterns 19a and 19b on the resist film 5, as shown in FIG. 7.

Figure 8:
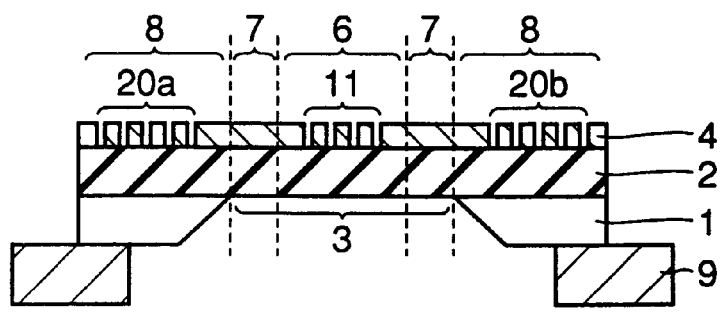

Then, the X-ray absorber film 4 is partially removed by etching through masks of the transfer pattern 18 and the preliminary drawing patterns 19a and 19b formed on the resist film 5, for forming a transfer pattern 11 and preliminary drawing patterns 20a and 20b on the X-ray absorber film 4, as shown in FIG. 8. Thereafter the resist film 5 (see FIG. 7) is removed. Thus, the X-ray mask shown in FIG. 8 can be obtained.

Referring to FIG. 8, the preliminary drawing patterns 20a and 20b may alternatively be formed on the transfer pattern peripheral region 7. When the preliminary drawing patterns 20a and 20b are formed on positions closer to the transfer pattern 11, the position irradiated with the electron beam 10 in the preliminary drawing step shown in FIG. 4 can be closer to the transfer pattern forming region 6. Consequently, conditions for the heat inputted in the X-ray mask from the electron beam 10 in the preliminary drawing step can be closer to those in the step of drawing the transfer pattern. Thus, the X-ray mask can be more readily held to be in the state substantially identical to thermal equilibrium in the step of drawing the transfer pattern.

Embodiment 2

Figure 10:
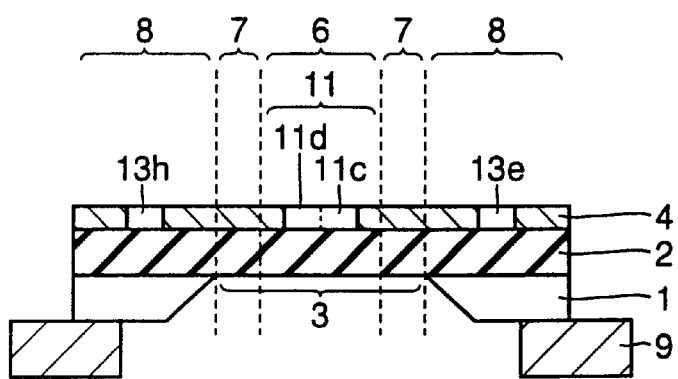
FIG. 10 is a typical sectional view of the X-ray mask taken along the line 100—100 in FIG. 9.

Referring to FIG. 10, an X-ray mask according to an embodiment 2 of the present invention includes a silicon wafer 1, a membrane 2, an X-ray absorber film 4 and a support ring 9. The membrane 2 is formed on the silicon wafer 1. The X-ray absorber film 4 is formed on the membrane 2. The support ring 9 is set on the lower surface of the silicon wafer 1. A window part 3 is formed in the silicon wafer 1 to expose the lower surface of the membrane 2. The X-ray absorber film 4 is provided with a transfer pattern 11 and preliminary drawing patterns 13e and 13h.

Figure 9:
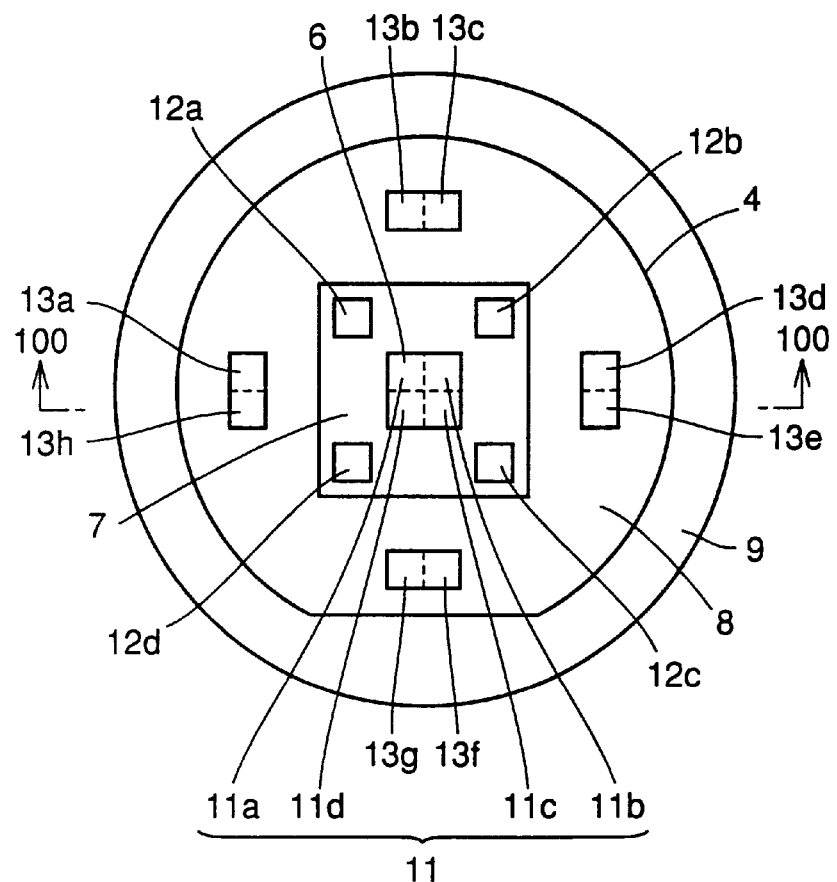
FIG. 9 is a typical plan view showing an X-ray mask according to an embodiment 2 of the present invention.

Referring to FIG. 9, the X-ray absorber film 4 can be divided into a transfer pattern forming region 6, a transfer pattern peripheral region 7 located on the window part 3 and a window part peripheral region 8. The transfer pattern 11 is formed on the transfer pattern forming region 6. The transfer pattern 11 includes transfer pattern parts 11a to 11d. Preliminary drawing patterns 12a to 12d are formed on the transfer pattern peripheral region 7. Preliminary drawing patterns 13a to 13h are formed on the window part peripheral region 8. An effect similar to that of the X-ray mask according to the embodiment 1 of the present invention can be attained due to such formation of the preliminary drawing patterns 12a to 12d and 13a to 13h.

Each of the preliminary drawing patterns 12a to 12d and 13a to 13h includes a pattern identical to any of the transfer pattern parts 11a to 11d. Therefore, the dose of an electron beam and the amount of stage movement for drawing the preliminary drawing patterns 12a to 12d and 13a to 13h can be rendered substantially identical to those for forming the transfer pattern 11. Consequently, a state substantially identical to thermal equilibrium in a drawing step for forming the transfer pattern 11 can be readily implemented by the electron beam drawing and the stage movement for forming the preliminary drawing patterns 12a to 12d and 13a to 13h.

A method of manufacturing the X-ray mask shown in FIGS. 9 and 10 is basically similar to the method of manufacturing the X-ray mask according to the embodiment 1 of the present invention shown in FIGS. 3 to 8. In a preliminary drawing step, however, the patterns identical to parts of the transfer pattern 11 are drawn when drawing resist patterns for forming the preliminary drawing patterns 12a to 12d and 13a to 13h with an electron beam 10 (see FIG. 4). Thus, the X-ray mask shown in FIGS. 9 and 10 can be obtained.

Embodiment 3

A method of manufacturing an X-ray mask according to an embodiment 3 of the present invention basically includes steps similar to those of the method of manufacturing an X-ray mask according to the embodiment 1 of the present invention shown in FIGS. 3 to 8. In the method of manufacturing an X-ray mask according to the embodiment 3 of the present invention, an electron beam 10 (see FIG. 4) employed in a preliminary drawing step similar to that shown in FIG. 4 is applied in lower intensity than an electron beam 10 (see FIG. 5) in a step of drawing a transfer pattern similar to that shown in FIG. 5. Referring to FIG. 5, a transfer pattern forming region 6 located on a window part 3 is irradiated with the electron beam 10 in the step of drawing a transfer pattern. No silicon wafer 1 is present on a region located under the transfer pattern forming region 6. Therefore, part of the electron beam 10 is not absorbed by a membrane 2 or an X-ray absorber film 4 but transmitted through the X-ray mask. Consequently, the applied electron beam 10 includes part not contributing to temperature rise of the X-ray mask.

Referring to FIG. 4, a window part peripheral region 8 is irradiated with the electron beam 10 in the preliminary drawing step. The silicon wafer 1 is present on a region located under the window part peripheral region 8.

Therefore, the rate of part of the applied electron beam 10 absorbed by the X-ray mask to contribute to temperature rise thereof is higher than that of the electron beam 10 employed in the step of drawing the transfer pattern similar to that shown in FIG. 5. If the electron beams 10 employed in the preliminary drawing step and the step of drawing the transfer pattern are applied in the same intensity, the temperature of the X-ray mask is increased at different rates.

In this embodiment, therefore, the electron beam 10 employed in the preliminary drawing step similar to that shown in FIG. 4 is rendered smaller in intensity than the electron beam 10 employed in the step of drawing the transfer pattern, for adjusting the quantity of heat inputted in the X-ray mask from the electron beam 10. Thus, the quantities of heat inputted in the X-ray mask from the electron beams 10 in the preliminary drawing step and the step of drawing the transfer pattern can be substantially equalized with each other. Consequently, the X-ray mask can be readily held in the preliminary drawing step to be in a state substantially identical to thermal equilibrium in the step of drawing the transfer pattern.

Embodiment 4

A method of manufacturing an X-ray mask according to an embodiment 4 of the present invention basically includes steps similar to those of the method of manufacturing an X-ray mask according to the embodiment 1 of the present invention shown in FIGS. 3 to 8. In the embodiment 4, an electron beam 10 (see FIG. 4) employed in a preliminary drawing step similar to that shown in FIG. 4 is applied in higher intensity than an electron beam 10 (see FIG. 5) employed in a step of drawing a transfer pattern similar to that shown in FIG. 5. In the preliminary drawing step, therefore, the quantity of heat inputted in the X-ray mask from the electron beam 10 per unit time can be increased. Consequently, the X-ray mask can be more quickly heated in the preliminary drawing step to be in a state substantially identical to thermal equilibrium in the step of drawing the transfer pattern. Thus, the time required for the preliminary drawing step can be reduced. Consequently, the time necessary for the steps of manufacturing the X-ray mask can be reduced, for reducing the cost for manufacturing the X-ray mask.

Embodiment 5

Figure 11:
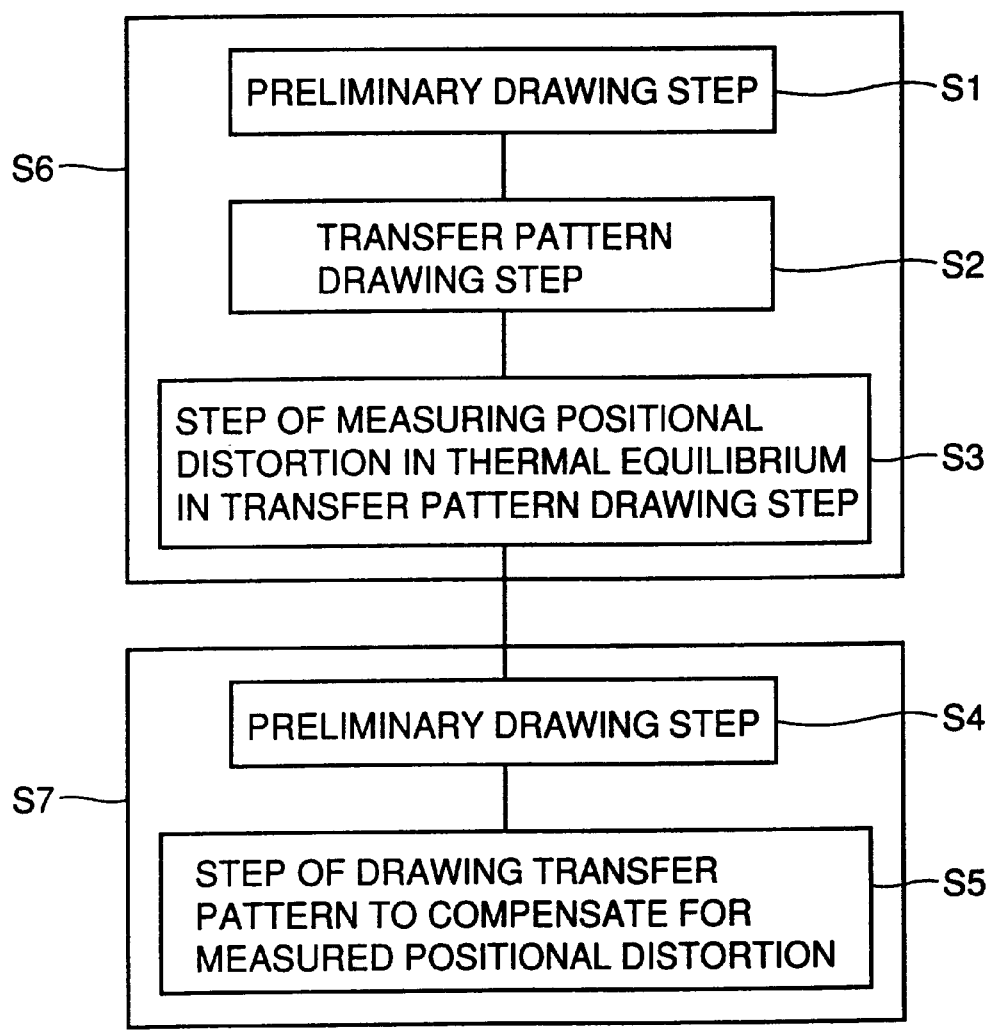
FIG. 11 is a process flow chart of a method of manufacturing an X-ray mask according to an embodiment 5 of the present invention.

With reference to FIG. 11, a method of manufacturing an X-ray mask according to an embodiment 5 of the present invention is now described.

Referring to FIG. 11, the method of manufacturing an X-ray mask according to this embodiment includes a step (S6) of previously measuring positional distortion in thermal equilibrium in a step of drawing a transfer pattern and a step (S7) of drawing the transfer pattern to compensate for the measured positional distortion. In the step (S6) of measuring the positional distortion, a preliminary drawing step (S1) is first carried out. Then, a transfer pattern drawing step (S2) is carried out. The step (S6) of measuring the positional distortion in thermal equilibrium of the X-ray mask is carried out in the transfer pattern drawing step (S2). At this time, the preliminary drawing step (S1) may not be carried out.

In the step (S7) of drawing the transfer pattern to compensate for the measured positional distortion, a preliminary drawing step (S4) is first carried out. Then, a step (S5) of drawing the transfer pattern is carried out to compensate for the positional distortion measured at the step S6.

Thus, an X-ray mask including a transfer pattern having higher accuracy can be prepared in addition to the effect of the embodiment 1 of the present invention, by previously measuring the positional distortion of the X-ray mask in the transfer pattern drawing step and reflecting the measured positional distortion on the drawing pattern for drawing the transfer pattern.

In the step (S6) of measuring the positional distortion in thermal equilibrium of the X-ray mask, the positional distortion may be measured by actual drawing with an electron beam, or may be calculated through simulation.

Embodiment 6

A method of manufacturing an X-ray mask according to an embodiment 6 of the present invention is now described with reference to FIG. 12.

Figure 12:
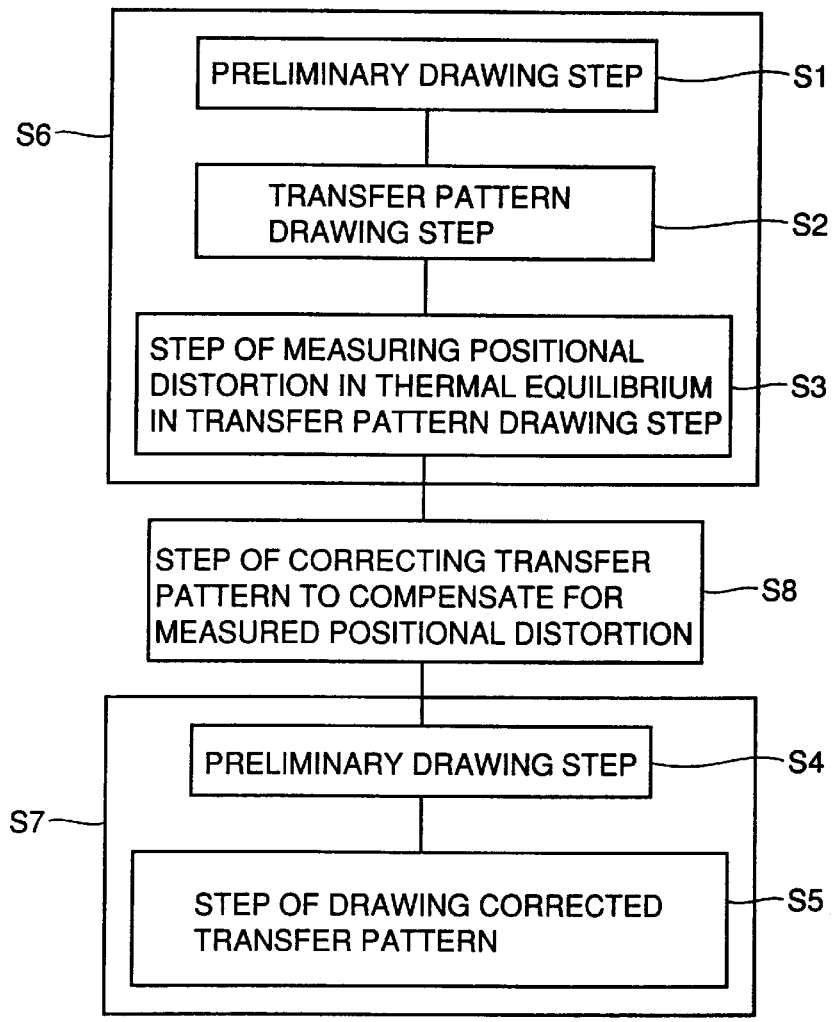
FIG. 12 is a process flow chart of a method of manufacturing an X-ray mask according to an embodiment 6 of the present invention.

Referring to FIG. 12, the method of manufacturing an X-ray mask according to the embodiment 6 of the present invention is basically similar to that shown in FIG. 11. In the method of manufacturing an X-ray mask according to the embodiment 6 of the present invention, however, a step (S3) of measuring positional distortion is followed by a step (S8) of correcting a transfer pattern to compensate for the measured positional distortion. A step (S5) of drawing the transfer pattern is carried out with the corrected transfer pattern.

Thus, an effect similar to that of the embodiment 5 of the present invention can be attained by drawing the corrected transfer pattern. Further, the transfer pattern is corrected to compensate for the positional distortion, and hence the present invention can be applied to a conventional electronic drawing unit or the like with no mechanical alteration. Consequently, the cost for manufacturing the X-ray mask can be prevented from being increased by alteration of the electron beam drawing unit or the like.

The method of manufacturing an X-ray mask according to the embodiment 6 of the present invention is now described with reference to FIG. 13.

First, steps similar to those shown in FIGS. 3 to 5 are carried out in a step (S6) of measuring the positional distortion shown in FIG. 12. Then, positional distortion ΔL of the X-ray mask is measured as the step (S3) (see FIG. 12) in a transfer pattern drawing step similar to that shown in FIG. 5.

Then, the step (S8) of correcting the transfer pattern is carried out to compensate for the measured positional distortion ΔL. A resist film 5 (see FIG. 5) is removed from the X-ray mask and a new resist mask is formed on an X-ray absorber film 4, for thereafter carrying out a step (S7) of drawing the transfer pattern to compensate for the positional distortion. Steps similar to those shown in FIGS. 3 and 4 are carried out and thereafter the transfer pattern is drawn on a transfer pattern forming region 14 with an electron beam 10, as shown in FIG. 13. At this time, the transfer pattern corrected to compensate for the positional distortion in the step S8 is employed.

Figure 13:
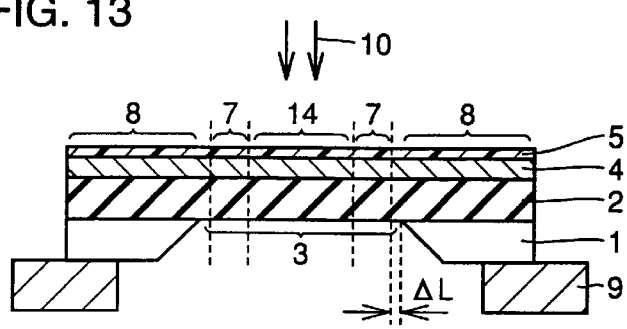
FIG. 13 is a typical sectional view showing a first step of the method of manufacturing an X-ray mask according to the embodiment 6 of the present invention.

The X-ray mask can be obtained by carrying out steps similar to those shown in FIGS. 6 to 8 after the step shown in FIG. 13. The transfer pattern is corrected in consideration of the positional distortion ΔL in the transfer pattern drawing step shown in FIG. 13, and hence an X-ray mask including a transfer pattern having high accuracy can be obtained.

Embodiment 7

A method of manufacturing an X-ray mask according to an embodiment 7 of the present invention is now described with reference to FIG. 14.

Figure 14:
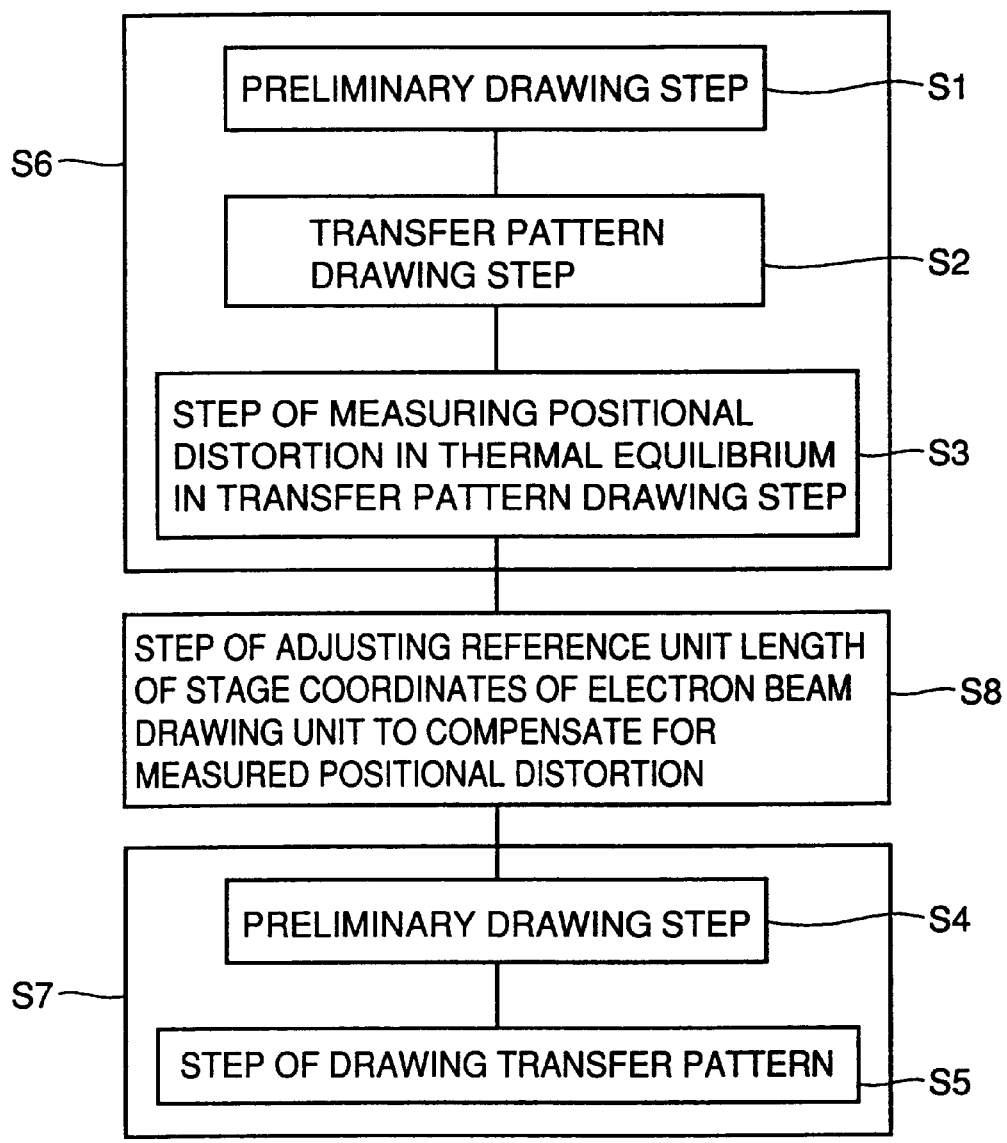
FIG. 14 is a process flow chart of a method of manufacturing an X-ray mask according to an embodiment 7 of the present invention.

Referring to FIG. 14, the method of manufacturing an X-ray mask according to the embodiment 7 of the present invention basically includes steps similar to those shown in FIG. 12. In the method of manufacturing an X-ray mask shown in FIG. 14, however, a step (S8) of adjusting the reference unit length of stage coordinates of an electron beam drawing unit is carried out to compensate for measured positional distortion, in place of the step (S8) of correcting the transfer pattern to compensate for the positional distortion shown in FIG. 12. In a step (S3) of measuring the positional distortion, the X-ray mask is in thermal equilibrium. Therefore, the positional distortion of this X-ray mask is substantially isotropic. Thus, a transfer pattern can be drawn to compensate for the positional distortion of the X-ray mask by adjusting the stage coordinates of the electron beam drawing unit in correspondence to the measured positional distortion. Therefore, an X-ray mask including a transfer pattern having high accuracy can be obtained without correcting a drawing pattern for the transfer pattern. Consequently, the steps of manufacturing the X-ray mask can be simplified.

Embodiment 8

A method of manufacturing an X-ray mask according to an embodiment 8 of the present invention is now described with reference to FIGS. 15 to 18.

Figure 15:
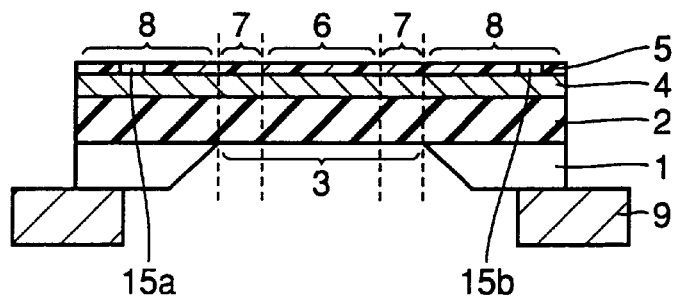
FIGS. 15 to 18 are typical sectional views showing first to fourth steps of a method of manufacturing an X-ray mask according to an embodiment 8 of the present invention.

The method of manufacturing an X-ray mask according to the embodiment 8 of the present invention is basically similar to that shown in FIG. 11. In the method of manufacturing an X-ray mask according to the embodiment 8, however, alignment marks formed on an X-ray mask are employed in a step (S6) (see FIG. 11) of measuring positional distortion. As shown in FIG. 15, alignment marks 15a and 15b are formed on an X-ray absorber film 4. Except the alignment marks 15a and 15b, the structure of the X-ray mask is basically similar to that shown in FIG. 3. The alignment marks 15a and 15b may be openings formed in a resist film 5, or projections formed on the X-ray absorber film 4 by films such as metal films reflecting an electron beam.

Figure 16:
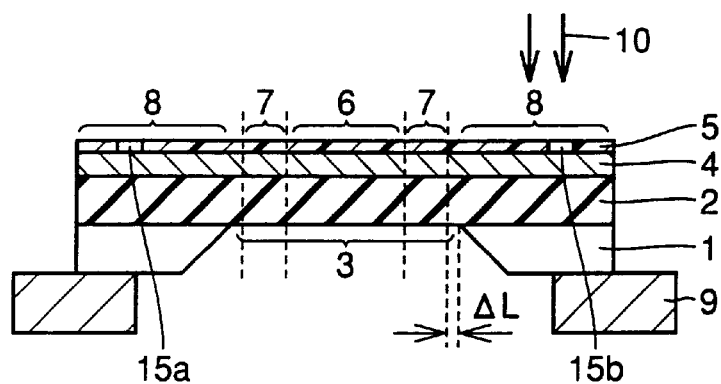

Then, a preliminary drawing step is carried out as shown in FIG. 16, similarly to the step shown in FIG. 4. The preliminary drawing step shown in FIG. 16 corresponds to the preliminary drawing step (S1) shown in FIG. 11.

Figure 17:
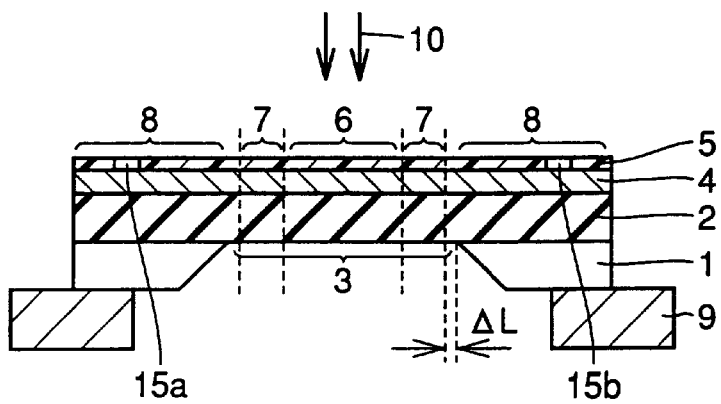

Then, a transfer pattern forming region 6 is irradiated with an electron beam 10 as shown in FIG. 17, for drawing a transfer pattern. This step corresponds to the transfer pattern drawing step (S2) in FIG. 11. At this time, the coordinates of the alignment marks 15a and 15b are measured as a step (S3) of measuring positional distortion in thermal equilibrium in the transfer pattern drawing step, for measuring positional distortion ΔL of the X-ray mask. Thus, the positional distortion ΔL is measured through the alignment marks 15a and 15b formed on regions adjacent to the transfer pattern forming region 6 on the X-ray mask, and hence the value of the positional distortion ΔL can be more correctly measured. When the value of the positional distortion ΔL can be correctly measured, the accuracy of the transfer pattern can be further improved.

Figure 18:
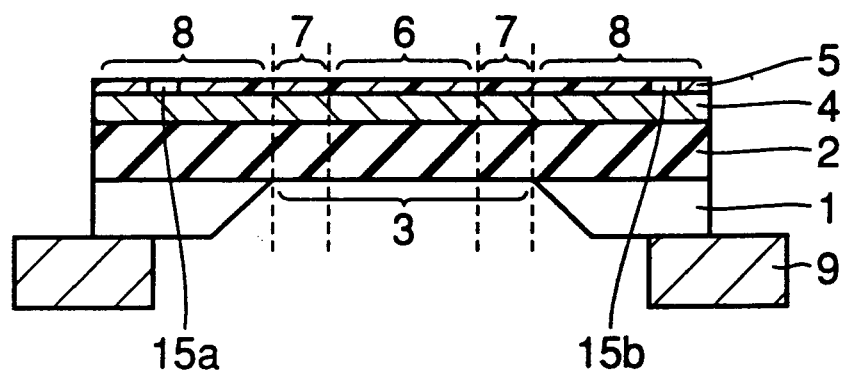

After completely measuring the positional distortion, the application of the electron beam 10 and stage movement are completed and hence the temperature of the X-ray mask is reduced. Consequently, the positional distortion ΔL of the X-ray mask caused by heat is reduced and the positional distortion caused by thermal expansion finally disappears. Thus, the state shown in FIG. 18 is attained.

Thereafter a step (S7) of drawing the transfer pattern is carried out to compensate for the measured distortion shown in FIG. 11. Thus, an X-ray mask including a transfer pattern having high accuracy can be obtained.

In the X-ray mask prepared by the aforementioned method, a preliminary drawing pattern formed in a preliminary drawing step (S4) (see FIG. 11) may be only partially provided on a region other than a transfer pattern forming region 6 (see FIG. 18), similarly to the embodiment 2 of the present invention. Further, the preliminary drawing pattern may include a pattern identical to a part of the transfer pattern. In addition, the preliminary drawing pattern including the pattern identical to a part of the transfer pattern may be formed on the overall region other than the transfer pattern forming region 6.

Figure 19:
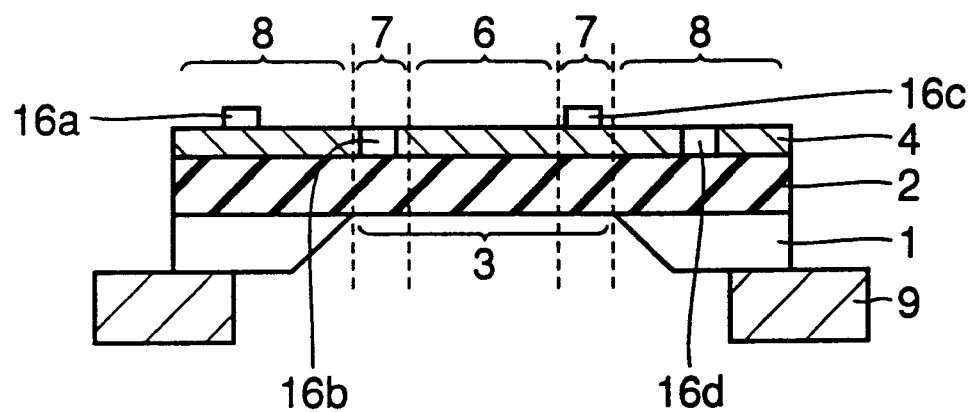
FIG. 19 is a typical sectional view showing an X-ray mask provided with alignment marks according to a modification of the embodiment 8 of the present invention.

Referring to FIG. 19, alignment marks 16a and 16d may be formed on a window part peripheral region 8. Further, alignment marks 16b and 16c may be formed on a transfer pattern peripheral region 7 located on a window part. Further, alignment marks 16b and 16d may be prepared from openings formed in an X-ray absorber film 4. Further, alignment marks 16a and 16c may be prepared from projections of metal films formed on the X-ray absorber film 4. The projections of metal films may be formed by depositing a metal film on the X-ray absorber film 4 and patterning the same in a prescribed shape.

Figure 20:
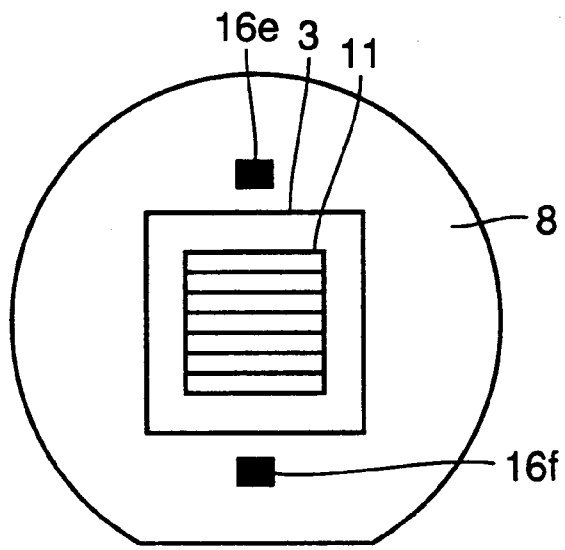
FIGS. 20 to 23 are typical plan views showing first to fourth examples of the alignment marks formed on the X-ray mask according to the embodiment 8 of the present invention.
Figure 21:
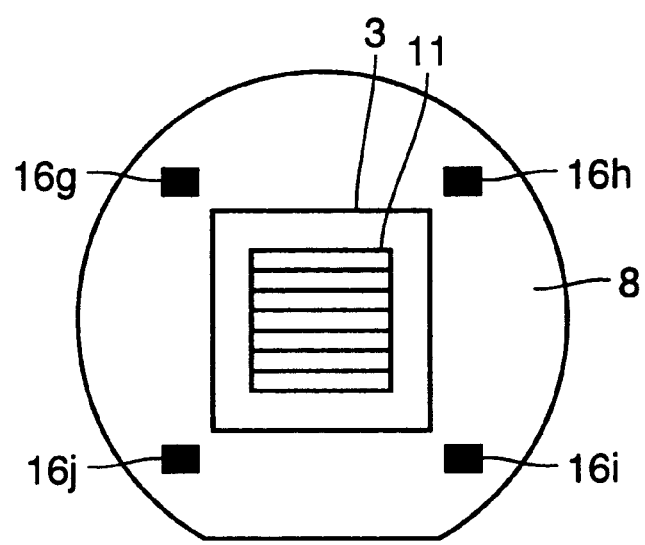

Referring to FIG. 20, alignment marks 16e and 16f are formed on a window part peripheral region 8. Referring to FIG. 21, four alignment marks 16g to 16j may be formed on a window part peripheral region 8. These alignment marks 16g to 16j may be arranged on extensions of the diagonals of a square forming the planar outline of a window part 3.

Figure 22:
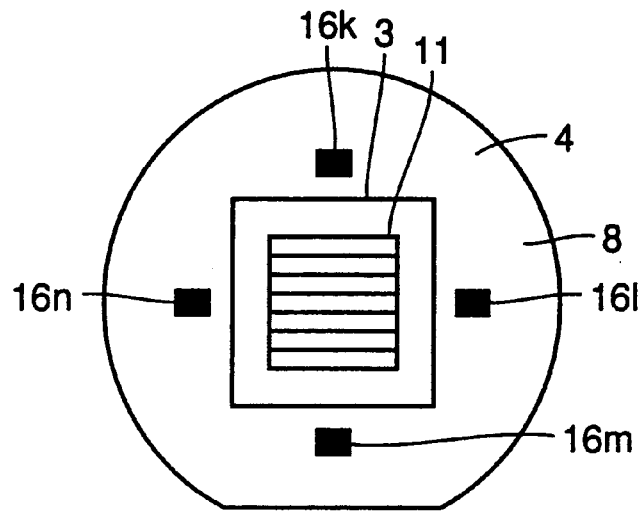
Figure 23:
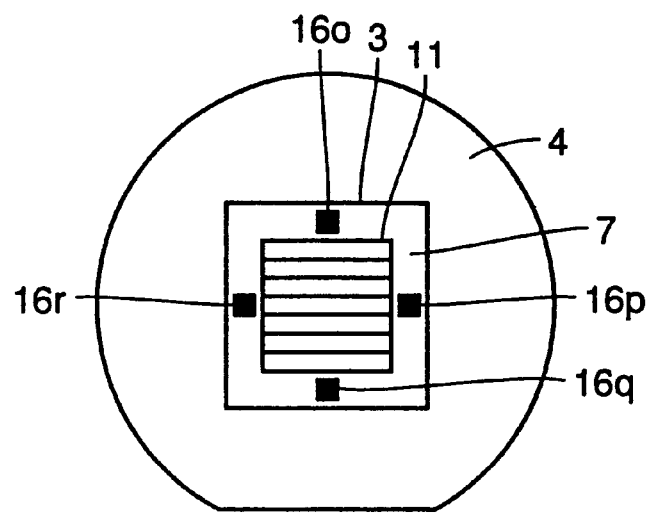

Referring to FIG. 22, alignment marks 16k to 16n may be arranged on the vertical bisectors of the respective sides of a square forming the planar outline of a window part 3. Referring to FIG. 23, alignment marks 16o to 16r may be formed on a transfer pattern peripheral region 7 located on a window part.

Referring to each of FIGS. 20 to 23, a preliminary drawing pattern (not shown) is partially formed on a region other than that provided with a transfer pattern 11. The preliminary pattern may include a pattern identical to a part of the transfer pattern 11. The preliminary pattern including the pattern identical to a part of the transfer pattern 11 may be formed on the overall surface of the region other than that formed with the transfer pattern 11.

Embodiment 9

A method of manufacturing an X-ray mask according to an embodiment 9 of the present invention is basically similar to that according to the embodiment 1 of the present invention. In the method of manufacturing an X-ray mask according to the embodiment 9, however, alignment marks are formed on an X-ray absorber film of an X-ray mask. These alignment marks are employed for correcting beam drifting or distortion of a field shape in a step of drawing a transfer pattern corresponding to that shown in FIG. 5. An operation such as stage movement is periodically performed for detecting the alignment marks. In the method of manufacturing an X-ray mask according to the embodiment 9, the operation of detecting the alignment marks is performed in a preliminary drawing step corresponding to that shown in FIG. 4.

Therefore, conditions for stage movement and application of an electron beam in the preliminary drawing step can be closer to those in a step of drawing a transfer pattern.

Consequently, the X-ray mask can be held to be in a state substantially identical to thermal equilibrium in the step of drawing the transfer pattern. Thus, the X-ray mask can be further inhibited from temperature fluctuation in the step of drawing the transfer pattern, and hence an X-ray mask including a transfer pattern having higher accuracy can be obtained.

Embodiment 10

A method of manufacturing an X-ray mask according to an embodiment 10 of the present invention is now described with reference to FIG. 24.

First, a preliminary moving step (S1) of moving a stage carrying an X-ray mask thereon is carried out. At this time, the temperature of the X-ray mask is increased due to heat generated by the stage movement. The stage is moved until the X-ray mask enters a state substantially identical to thermal equilibrium in a step (S2) of drawing a transfer pattern. Then, the step (S2) of drawing the transfer pattern is carried out.

Figure 24:
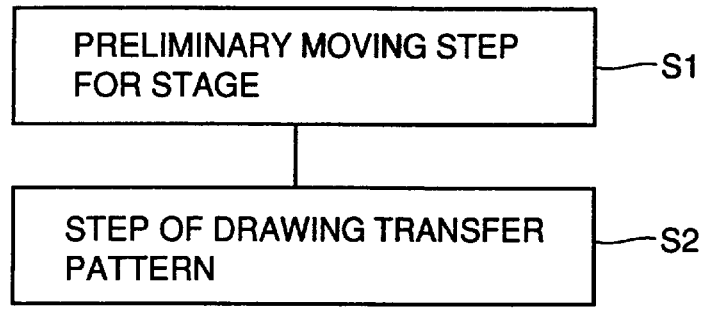
FIG. 24 is a process flow chart of a method of manufacturing an X-ray mask according to an embodiment 10 of the present invention.

The method of manufacturing an X-ray mask corresponding to the process flow chart shown in FIG. 24 is now described with reference to FIGS. 25 and 26.

Figure 25:
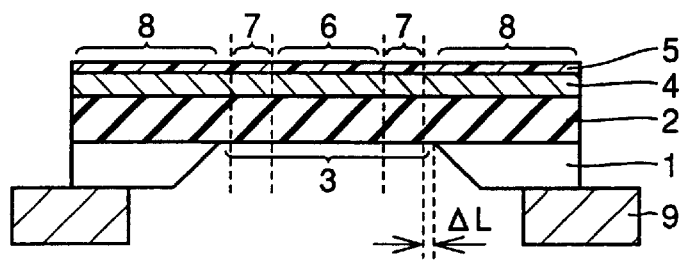
FIGS. 25 and 26 are typical sectional views showing first and second steps of the method of manufacturing an X-ray mask according to the embodiment 10 of the present invention.

A step similar to that shown in FIG. 3 is carried out for thereafter carrying out the preliminary moving step for the stage carrying the X-ray mask thereon, as shown in FIG. 25. The temperature of the X-ray mask is increased due to heat generated by the stage movement. Consequently, the X-ray mask is positionally distorted by the heat. The pattern of stage movement in the preliminary moving step is basically similar to that in the step of drawing the transfer pattern. Thus, the quantity of heat generated by the stage movement in the step of drawing the transfer pattern can be substantially identical to that of heat generated by the stage movement in the preliminary moving step for the stage.

Alternatively, the pattern of stage movement in the preliminary moving step may be different from that in the step of drawing the transfer pattern. In this case, the pattern is so adjusted that the quantity of heat generated by the stage movement is substantially identical to that in the step of drawing the transfer pattern. Alternatively, the rate of the stage movement in the preliminary moving step may be larger than that in the step of drawing the transfer pattern, so that the quantity of heat generated by this stage movement is larger than that in the step of drawing the transfer pattern. Consequently, the time for the preliminary moving step can be reduced.

Figure 26:
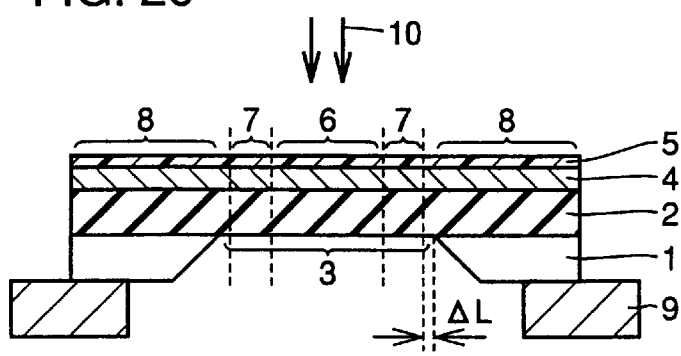

Then, the step (S2) (see FIG. 24) of drawing the transfer pattern on a transfer pattern forming region 6 is carried out as shown in FIG. 26. If an electron beam 10 employed in the step of drawing the transfer pattern has high energy, part thereof may not be absorbed by a membrane 2 or the like but transmitted through the X-ray mask. Depending on the level of the energy of the electron beam 10, the quantity of heat inputted in the X-ray mask from the electron beam 10 may be substantially negligible. In this case, only heat inputted in the X-ray mask following stage movement may be taken into consideration. The method of manufacturing an X-ray mask according to the embodiment 10 of the present invention is particularly effective for such a case.

Thus, the X-ray mask can be held to be in the state substantially identical to thermal equilibrium in the step of drawing the transfer pattern through the preliminary moving step for the stage, and hence an effect similar to that of the embodiment 1 of the present invention can be attained.

Embodiment 11

A method of manufacturing an X-ray mask according to an embodiment 11 of the present invention is now described with reference to FIG. 27.

Figure 27:
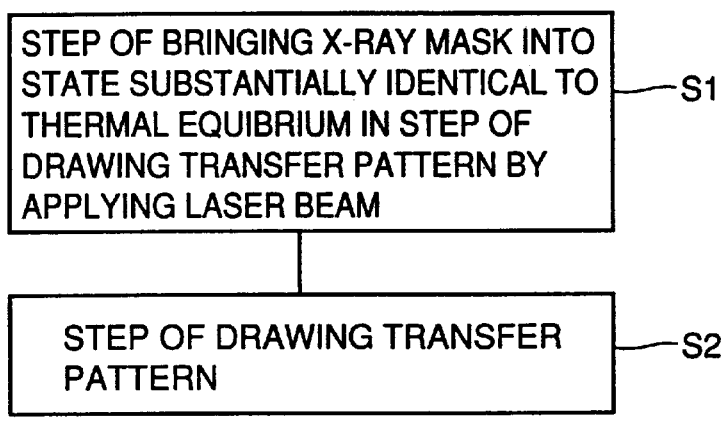
FIG. 27 is a process flow chart of a method of manufacturing an X-ray mask according to an embodiment 11 of the present invention.

Referring to FIG. 27, an X-ray mask is irradiated with a laser beam, for carrying out a step (S1) of bringing the X-ray mask into a state substantially identical to thermal equilibrium in a step (S2) of drawing a transfer pattern. Then, the step (S2) of drawing the transfer pattern is carried out.

Thus, the X-ray mask is irradiated with the laser beam, which is an energy beam, before the step (S2) of drawing the transfer pattern to be in the state substantially identical to thermal equilibrium in the step (S2) of drawing the transfer pattern, and hence an effect similar to that of the method of manufacturing an X-ray mask according to the embodiment 1 of the present invention can be attained.

The method of manufacturing an X-ray mask according to the embodiment 11 is now described with reference to FIG. 28.

Figure 28:
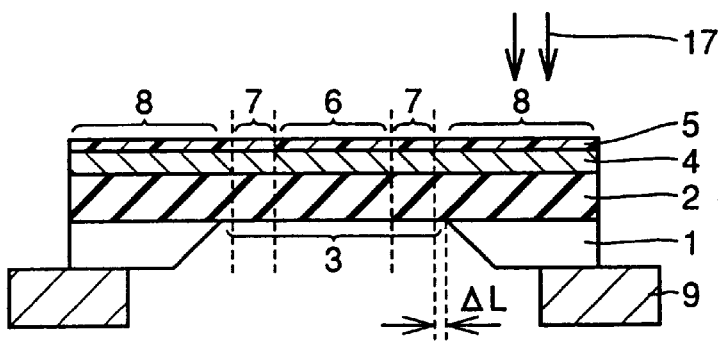
FIG. 28 is a typical sectional view showing a first step of the method of manufacturing an X-ray mask according to the embodiment 11 of the present invention.
Figure 29:
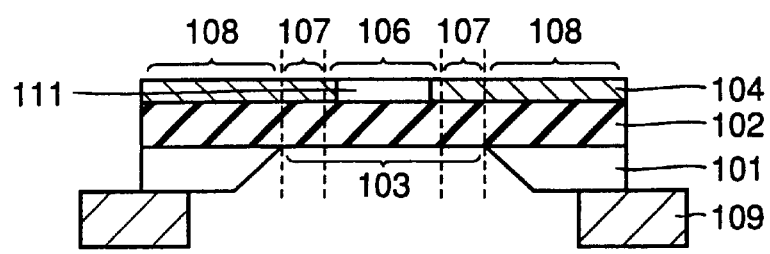
FIG. 29 is a typical sectional view of a conventional X-ray mask.
Figure 30:
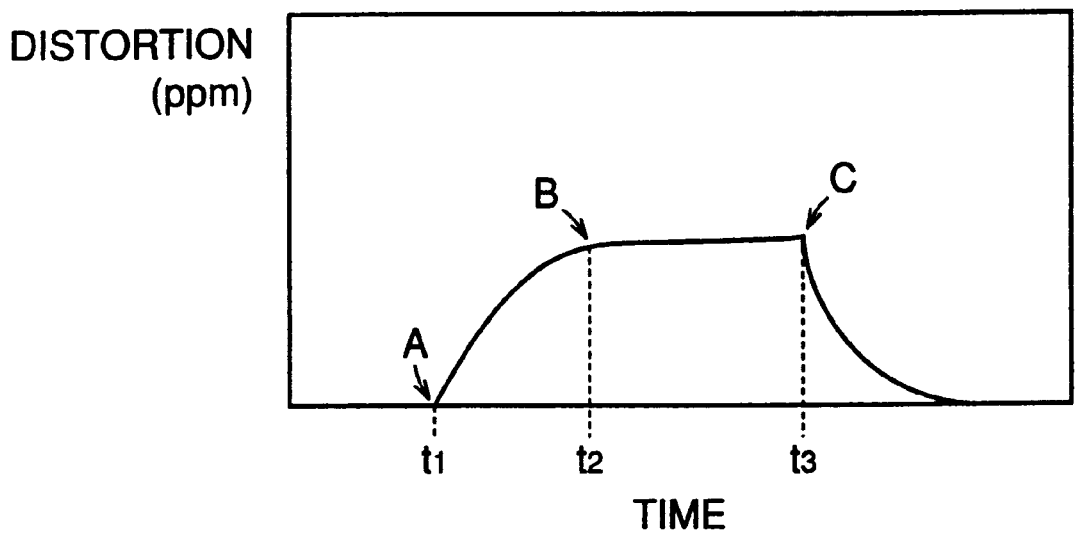
FIG. 30 is a graph showing the qualitative relation between positional distortion of an X-ray mask caused by temperature rise when drawing a resist pattern with an electron beam in a step of manufacturing the conventional X-ray mask and time.

A step similar to that shown in FIG. 3 is carried out for thereafter irradiating a window part peripheral region 8 with a laser beam 17, as shown in FIG. 28. The X-ray mask is brought into the state substantially identical to thermal equilibrium in the step of drawing the transfer pattern due to application of the laser beam 17. Consequently, positional distortion takes place.

Thereafter steps similar to those shown in FIG. 5 to 8 are carried out. Thus, an X-ray mask including a transfer pattern having high accuracy can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an X-ray mask comprising steps of:
    forming an X-ray absorber film preventing transmission of an X-ray on a substrate;
    forming a resist film on said X-ray absorber film;
    placing said substrate on a movable member;
    drawing a transfer pattern on said resist film by repeating steps of moving said moving member and irradiating said resist film with an energy beam; and
    holding a mask member including said resist film, said X-ray absorber film and said substrate to be in a state substantially identical to thermal equilibrium in said drawing step between said step of placing said substrate on said movable member and said drawing step.

2. The method of manufacturing an X-ray mask in accordance with claim 1, wherein
    said step of holding said mask member includes a step of drawing a preliminary drawing pattern on a region of said mask member other than that to be provided with said transfer pattern.

3. The method of manufacturing an X-ray mask in accordance with claim 2, wherein
    said preliminary drawing pattern includes a pattern substantially identical to a part of said transfer pattern.

4. The method of manufacturing an X-ray mask in accordance with claim 2, wherein
    said preliminary drawing pattern is drawn with an energy beam in said step of drawing said preliminary drawing pattern, and
    said energy beam employed in said step of drawing said preliminary drawing pattern is lower in intensity than that employed in said drawing step.

5. The method of manufacturing an X-ray mask in accordance with claim 2, wherein said preliminary drawing pattern is drawn with an energy beam in said step of drawing said preliminary drawing pattern, and said energy beam employed in said step of drawing said preliminary drawing pattern is higher in intensity than that employed in said drawing step.

6. The method of manufacturing an X-ray mask in accordance with claim 1, further including a step of measuring relative distortion of said mask member in said drawing step with respect to said mask member held at the room temperature, wherein said drawing step includes a step of drawing a pattern in consideration of said distortion.

7. The method of manufacturing an X-ray mask in accordance with claim 6, wherein said step of drawing said pattern in consideration of said distortion includes steps of:

converting said pattern to a corrected pattern corresponding to said distortion, and drawing said corrected pattern on said resist film.

8. The method of manufacturing an X-ray mask in accordance with claim 6, wherein said step of drawing said pattern in consideration of said distortion includes a step of adjusting a reference unit length in movement of said movable member in consideration of said distortion.

9. The method of manufacturing an X-ray mask in accordance with claim 6, further including a step of forming an alignment mark on said substrate, wherein said step of measuring said distortion includes a step of measuring the position of said alignment mark.

10. The method of manufacturing an X-ray mask in accordance with claim 1, further including a step of forming an alignment mark on said substrate, wherein said step of holding said mask includes a step of detecting said alignment mark.

11. The method of manufacturing an X-ray mask in accordance with claim 1, wherein said step of holding said mask member includes a preliminary moving step of moving said movable member.

12. The method of manufacturing an X-ray mask in accordance with claim 11, wherein said preliminary moving step includes a step of moving said movable member in a moving state substantially identical to that in drawing of a partial pattern while moving said movable member in said drawing step.

13. The method of manufacturing an X-ray mask in accordance with claim 1, wherein said energy beam is an electron beam.

14. The method of manufacturing an X-ray mask in accordance with claim 1, wherein said step of holding said mask member includes a step of irradiating said mask member with a laser beam.

15. An X-ray mask comprising:

a substrate; and an X-ray absorber film formed on said substrate for preventing transmission of an X-ray, wherein said X-ray absorber film includes:
 a transfer pattern, and
 a dummy pattern only partially formed on a region other than that formed with said transfer pattern.

16. The X-ray mask in accordance with claim 15, wherein said dummy pattern includes a pattern substantially identical to a part of said transfer pattern.

17. The X-ray mask in accordance with claim 15, further including an alignment mark formed on said substrate.

18. An X-ray mask comprising:

a substrate; and an X-ray absorber film formed on said substrate for preventing transmission of an X-ray, wherein said X-ray absorber film includes:
 a transfer pattern, and
 a dummy pattern, formed on a region other than that formed with said transfer pattern, having a pattern substantially identical to a part of said transfer pattern.

19. The X-ray mask in accordance with claim 18, further including an alignment mark formed on said substrate.

20. The X-ray mask in accordance with claim 18, wherein said substrate includes a membrane formed to be in contact with said X-ray absorber film.

* * * * *